United States Patent
Gu et al.

(10) Patent No.: US 10,636,696 B1
(45) Date of Patent: Apr. 28, 2020

(54) METHODS FOR FORMING VIAS IN POLYMER LAYERS

(71) Applicant: APPLIED MATERIALS, INC., Santa Clara, CA (US)

(72) Inventors: Yu Gu, Singapore (SG); Guan Huei See, Singapore (SG); Peng Suo, Singapore (SG); Prayudi Lianto, Singapore (SG); Arvind Sundarrajan, Singapore (SG)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 16/251,355

(22) Filed: Jan. 18, 2019

(51) Int. Cl.
   *H01L 21/768* (2006.01)
   *H01L 21/311* (2006.01)
   *H01L 23/522* (2006.01)

(52) U.S. Cl.
   CPC .. *H01L 21/76804* (2013.01); *H01L 21/31138* (2013.01); *H01L 23/5226* (2013.01)

(58) Field of Classification Search
   CPC .................................................... H01L 21/768
   See application file for complete search history.

(56) References Cited

U.S. PATENT DOCUMENTS

| | | | |
|---|---|---|---|
| 4,714,516 | A | 12/1987 | Eichelberger et al. |
| 4,764,485 | A | 8/1988 | Loughran et al. |
| 7,579,308 | B2 | 8/2009 | Lee |
| 8,836,116 | B2 | 9/2014 | Yang |
| 2006/0094613 | A1 | 5/2006 | Lee |

FOREIGN PATENT DOCUMENTS

WO     WO 88/02550     4/1988

OTHER PUBLICATIONS

"Etching Process", downloaded from https://www.memsnet.org/about/processes/etch.html.

*Primary Examiner* — Marvin Payen
(74) *Attorney, Agent, or Firm* — Moser Taboada; Alan Taboada

(57) ABSTRACT

A method of processing a substrate includes depositing a layer of uncured polymer material atop a substrate to cover an exposed conductive layer on the substrate, exposing at least one area of the layer using a photolithography process, developing the layer in the photolithography process to remove a first portion of uncured polymer material from the at least one area, etching the layer with a dry etch process to remove a second portion of uncured polymer material from the at least one area to expose a top surface of the conductive layer and form a via in the layer, and curing the layer to form a cured polymer material.

20 Claims, 3 Drawing Sheets

METHODS FOR FORMING VIAS IN POLYMER LAYERS

FIELD

Embodiments of the present disclosure generally relate to semiconductor processing. Specifically, embodiments of the present disclosure relate to forming vias in polymer layers disposed on a substrate for semiconductor packaging.

BACKGROUND

In the manufacturing of electronic devices, the ever increasing device density places heavy demands on requirements in the packaging or interconnecting techniques of such highly dense devices. The fabrication of such electronic devices typically involves some form of substrate level packaging. The substrate level packaging may include forming vias and similar structures to provide internal and external device connections, for example input/output (I/O) connectivity. The formation of vias may involve the use of a polymer material having dielectric properties and stress buffering capabilities. However, the inventors have observed that as via sizes scale down in size, the polymer via openings cannot be reliably formed in the polymer material.

Thus, the inventors have developed improved techniques to form vias in polymer materials.

SUMMARY

Methods and apparatus for forming polymer vias on wafer level packaging are provided herein.

In some embodiments, a method of forming a via in a substrate comprises depositing a layer of uncured polymer material atop a substrate to cover a conductive layer which is exposed on the substrate, exposing at least one area of the layer of uncured polymer material using a photolithography process, developing the layer of uncured polymer material in the photolithography process to remove a first portion of uncured polymer material from the at least one area, etching the layer of uncured polymer material with a dry etch process to remove a second portion of uncured polymer material from the at least one area to expose a top surface of the conductive layer and form a via in the layer of uncured polymer material, and curing the layer of uncured polymer material to form a cured polymer material layer.

In some embodiments, the method may further comprise using a plasma based dry etch process to etch the layer of uncured polymer material, etching the layer of uncured polymer material with an oxygen based gas, etching the layer of uncured polymer material with a carbon tetrafluoride based gas, adjusting a bias power to enhance a perpendicular etching aspect of the plasma based dry etch process relative to a top surface of the substrate, adjusting a gas flow to enhance a perpendicular etching aspect of the plasma based dry etch process relative to a top surface of the substrate, blanket etching the substrate with the plasma based dry etching process such that the second portion of uncured polymer material is etched at a higher etch rate than an upper surface of the substrate, forming the via in the layer of uncured polymer material with a size of less than approximately 10 microns, forming the via in the layer of uncured polymer material with a size of less than approximately 5 microns, using an optical mask to expose the at least one area of the layer of uncured polymer material on the substrate in the photolithography process, forming the via with a sidewall profile angle of approximately 80 degrees to approximately 90 degrees, and/or wherein the conductive layer is a copper-based material, an aluminum-based material, a gold-based material, a silver-based material.

In some embodiments, a method for forming a via in a substrate comprises spin coating a layer of uncured polymer material atop a substrate to cover at least one conductive layer that is exposed on the substrate, exposing at least one area of the layer of uncured polymer material above the at least one conductive layer with an ultraviolet light, removing a first portion of uncured polymer material from the at least one area exposed by the ultraviolet light with a solvent wash, etching the layer of uncured polymer material with an anisotropic dry etch process to remove a second portion of uncured polymer material from the at least one area to expose a top surface of the conductive layer and form a via of less than or equal to approximately 10 microns in the layer of uncured polymer material, and curing the layer of uncured polymer material to form a cured polymer material layer.

In some embodiments, the method may further comprise using a plasma based dry etch process to etch the layer of uncured polymer material, etching the layer of uncured polymer material with an oxygen based gas or a carbon tetrafluoride based gas, adjusting a bias power to enhance a perpendicular etching aspect of the plasma based dry etch process relative to a top surface of the substrate, adjusting a gas flow to enhance a perpendicular etching aspect of the plasma based dry etch process relative to a top surface of the substrate, and/or curing the layer of uncured polymer material at a temperature of approximately 180° C. to approximately 350° C. to form the cured polymer material layer.

In some embodiments, a non-transitory computer readable medium having instructions stored thereon that, when executed, cause a method of operating a wafer level processing system to be performed, the method comprises spin coating a layer of uncured polymer material atop a substrate to cover at least one conductive layer that is exposed on the substrate, exposing at least one area of the layer of uncured polymer material above the at least one conductive layer with an ultraviolet light, removing a first portion of uncured polymer material from the at least one area exposed by the ultraviolet light with a solvent wash, etching the layer of uncured polymer material with an anisotropic dry etch process to remove a second portion of uncured polymer material from the at least one area to expose a top surface of the conductive layer and form a via of less than or equal to approximately 10 microns in the layer of uncured polymer material, and curing the layer of uncured polymer material to form a cured polymer material layer.

In some embodiments, the non-transitory computer readable medium further comprises a method wherein the via has a width or diameter of less than or equal to approximately five microns.

In some embodiments, a substrate for a packaging application comprises an uncured polymer layer disposed atop a substrate, a conductive layer disposed in the substrate adjacent to and beneath the uncured polymer layer, and an opening formed through the uncured polymer layer to expose a portion of the conductive layer, wherein the opening has a width or diameter of less than or equal to approximately 10 microns.

In some embodiments, the substrate may further comprise wherein the opening has a width or diameter of less than or equal to approximately five microns.

Other and further embodiments are disclosed below.

BRIEF DESCRIPTION OF THE DRAWINGS

Embodiments of the present principles, briefly summarized above and discussed in greater detail below, can be understood by reference to the illustrative embodiments of the principles depicted in the appended drawings. However, the appended drawings illustrate only typical embodiments of the principles and are thus not to be considered limiting of scope, for the principles may admit to other equally effective embodiments.

Figure 1:
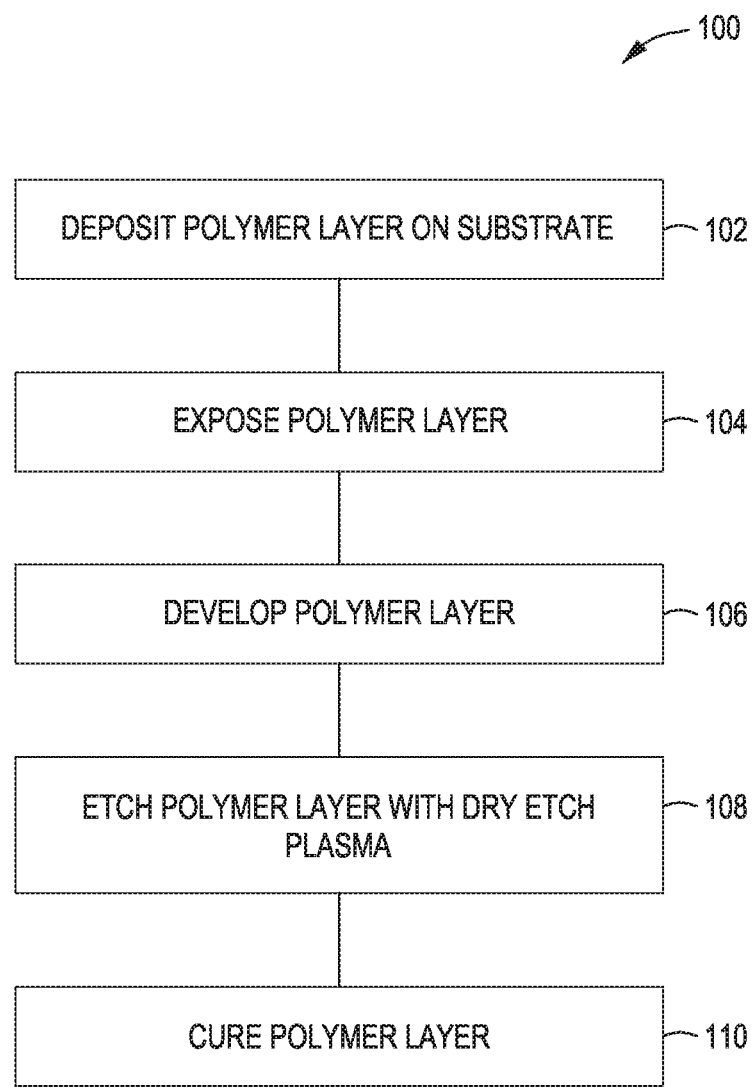
FIG. 1 is a method of forming a via in a polymer layer on a substrate in accordance with some embodiments of the present principles.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

The methods described permit the formation of vias in polymer material on a substrate prior to the polymer being cured. The methods advantageously provide the formation of vias of approximately 10 microns or less in width with substantially vertical sidewalls. In some embodiments, the vias may have a width of approximately five microns or less. The vias advantageously allow direct via-stacked-on-via designs that further improve the allowable I/O density. The methods may advantageously be utilized in advanced substrate-level packaging and in fan-out substrate level packaging for via critical dimension (CD) scaling. The methods are compatible with current wafer level packaging processes, and, therefore, provide an economical solution to increasing packaging densities for OSAT (Outsourced Semiconductor Assembly and Test) facilities. In addition, the methods permit higher aspect ratio vias to be formed (thicker polymer coatings can be utilized).

FIG. 1 depicts a method 100 for forming a via in a layer of uncured polymer material. The method 100 is described in accordance with the stages of substrate packaging depicted in FIGS. 2A-2E. Each of FIGS. 2A-2E includes a side view for the particular stage of via formation. The method 100 may be performed in any suitable process chamber configured for the processes described below. Exemplary processing chambers and systems that may be used to perform the inventive methods disclosed herein may include, but are not limited to, various processing systems commercially available from Applied Materials, Inc., of Santa Clara, Calif. Other process chambers, including ones available from other manufacturers, may also be suitably used in connection with the teachings provided herein.

Figure 2A:
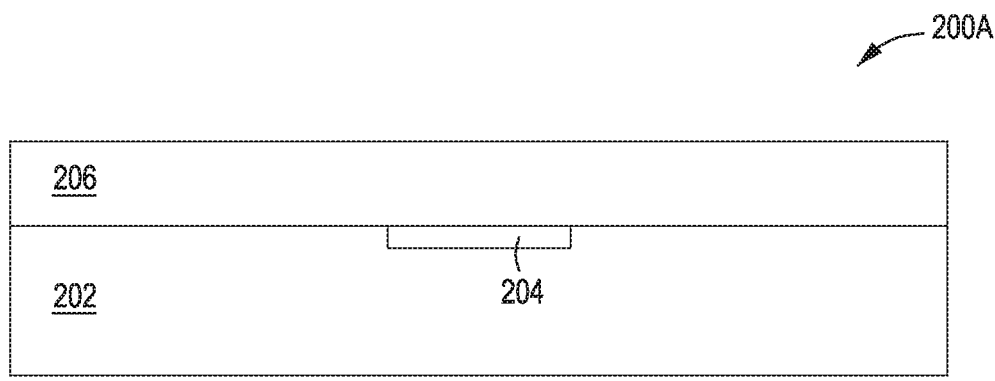
FIGS. 2A-2E depicts sequential side views of the stages of forming a via in a polymer layer in accordance with some embodiments of the present principles.

The method 100 is performed on a substrate, such as the substrate 202 depicted in FIG. 2A. In some embodiments, the substrate 202 is composed of a material used in a semiconductor manufacturing process. For example, the substrate 202 may comprise one or more of silicon (Si), germanium, silicon germanium, doped or undoped polysilicon, doped or undoped silicon, and patterned or non-patterned silicon on insulators (SOI), or the like. The substrate 202 may have various dimensions, such as 150 mm, 200 mm, 300 mm or 450 mm diameters or other dimensions. In addition, the substrate 202 may include additional layers of materials or may have one or more completed or partially completed structures or devices formed in or on the substrate 202.

For example, the substrate 202 may include a number of metallization levels (redistribution layers "RDLs") having one or more conductive layers, such as metal traces, or the like. One of these conductive layers 204 is shown in FIGS. 2A-2E. As depicted in FIG. 2A, the conductive layer 204 in the substrate 202 is partially exposed through a dielectric top portion of the substrate 202. The conductive layer 204 may comprise any suitable conductive material, such as copper (Cu), aluminum (Al), gold (Au), silver (Ag), or alloys thereof.

For example, the conductive layer 204 may be part of a dielectric layer deposited atop the substrate 202. In some embodiments, the dielectric layer may be a low-k dielectric material (e.g., a material having a dielectric constant less than silicon oxide, or less than about 3.9). Examples of suitable dielectric materials include silicon dioxide ($SiO_2$), fluorine-doped silicon dioxide, carbon-doped silicon dioxide, porous silicon dioxide, porous carbon-doped silicon dioxide, a spin-on organic polymeric dielectric, or a spin-on silicon based polymeric dielectric. When present, the dielectric may be deposited by using any suitable deposition method used for such materials in semiconductor manufacturing processes. The dielectric layer may be deposited to a thickness of, for example, about 100 to about 2,000 angstroms. The thickness of the first dielectric layer varies depending upon factors such as the technology node, the architecture design, the process flow scheme, or the like.

The method generally begins at block 102, and as depicted in view 200A of FIG. 2A, by depositing a layer 206 of uncured polymer material directly atop the substrate 202 and atop the exposed portion of the conductive layer 204. The layer 206 is photo-patternable (e.g., using photolithography or the like). For example, in some embodiments, such as for negative tone applications, the layer 206 comprises one or more polyimide (PI) compounds. In some embodiments, such as for positive tone applications, the layer 206 comprises polybenzoxazole (PBO). In some embodiments, the layer 206 can include benzocyclobutene, epoxy, or the like. In some embodiments, a phenol based polymer such as photosensitive dielectric materials sold under the WPR-5100 and WPR-5200 tradenames by JSR Corporation of Tokyo, Japan.

In substrate packaging applications consistent with the embodiments of the present principles, the layer 206 is provided to act as a dielectric with stress buffering properties. Accordingly, the layer 206 has a combination of mechanical properties configured to ensure robust chip-package reliability (e.g., thermal cycling, drop test, etc.).

In some embodiments, the layer 206 is blanket deposited (i.e., deposited atop the entire exposed surface of the conductive layer 204) to advantageously reduce or eliminate roughness at the interface of the substrate 202 and the conductive layer 204. The layer 206 may be deposited to a thickness of, for example, approximately 5 microns to approximately 20 microns (after curing the thickness may be approximately three microns to approximately 10 microns).

The thickness of the layer 206 can vary depending upon factors such as the technology node, the architecture design, the process flow scheme, or the like. The layer 206 may be deposited using any suitable deposition method commonly used in substrate packaging processes, such as spin coating and the like.

Typically, the resolution limit for forming vias in uncured polymer materials is 20 microns or larger. The resolution of uncured polymer is limited by the amorphous properties of the uncured polymer. Attempts to increase the resolution below 20 microns results in incomplete via formation after developing in a typical lithography process. Moreover, the inventors have observed that a via opening in uncured polymer typically exhibits an abnormal shape and has a less than vertical sidewall profile. The inventors have also observed that forming vias having smaller dimensions is advantageous in applications such as wafer level and/or fan-out wafer level packaging. In addition, the inventors believe that a reduced polymer via size is advantageous to reduce the effective area needed for via formation, thus allowing for more connectivity. The inventors believe that the reduced effective area needed for via formation would be especially valuable for very high I/O connectivity applications.

Figure 2B:
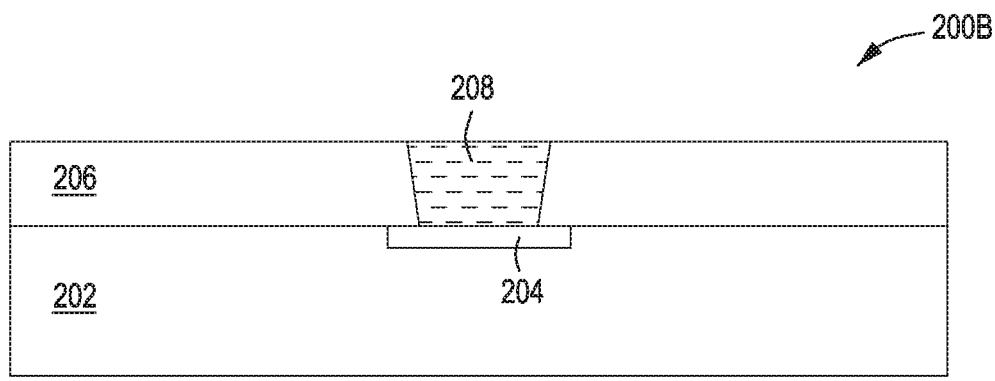
Figure 2C:
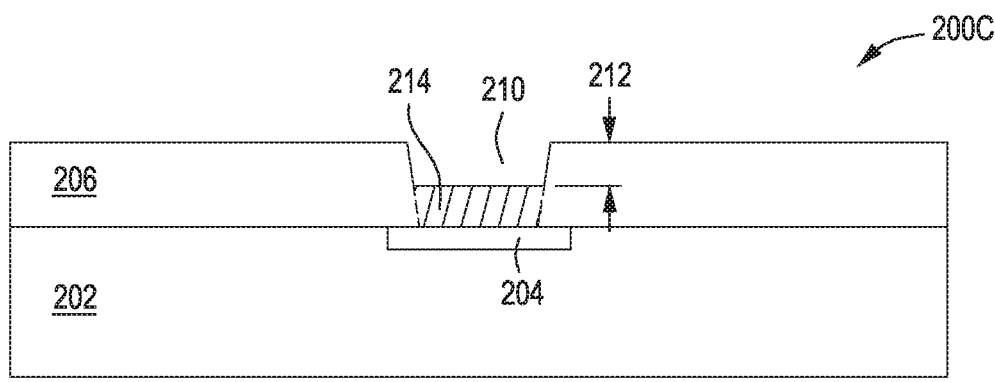

In block 104, a lithography process is performed to expose the layer 206. In some embodiments, the lithography process uses a photomask which, in some embodiments, may include an optical mask (projected mask) rather than a physical mask on the layer 206. The use of the optical mask simplifies the lithography process because the optical mask eliminates the need to form a physical resist mask on the surface of the layer 206 and eliminates the need to subsequently remove the physical resist mask after exposure. In some embodiments, the substrate 202 is exposed to ultraviolet (UV) light to initiate transformations in the polymer. The light initiates bond-breaking so that the exposed areas can be easily washed away by solvents during development stages of the lithography process. In some embodiments, the lithography process may use a mask, such as an optical mask, to control which areas of the layer 206 are exposed. As illustrated in FIG. 2B, a view 200B shows that the exposure was limited to an exposed portion 208 of the layer 206 residing above the conductive layer 204. The inventors have found that by exposing the layer 206 during the lithography process, that one or more of the material properties of the uncured polymer material in the exposed portion 208 are altered. The altered properties of the uncured polymer material are discussed in further detail below with regard to the etching process.

In block 106, the lithography process is continued by developing the exposed portion 208 of layer 206. In some embodiments, the developing process of the may use a solvent to wash away portions of the polymer material on the substrate 202. During the developing process, a first portion 210 of the exposed portion 208 is removed to a depth 212 as illustrated in a view 200C depicted in FIG. 2C. A second portion 214 of the exposed portion 208 remains after developing. The inadequate results after developing are believed by the inventors to be caused by the amorphous properties of the uncured polymer materials.

Figure 2D:
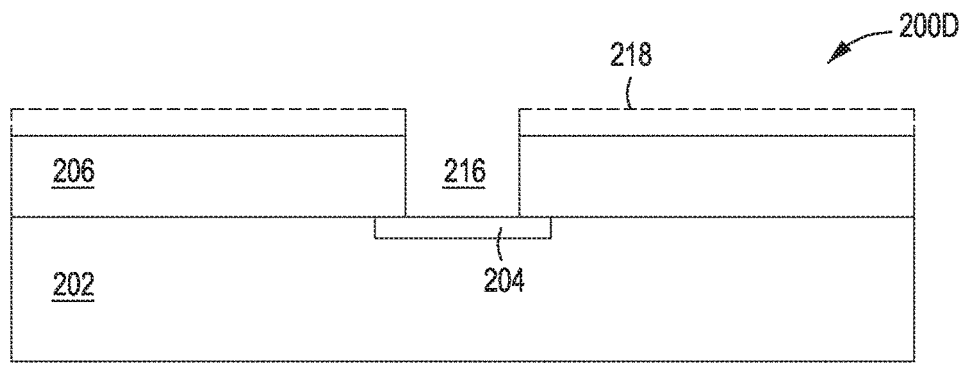

In block 108, the layer 206 is etched with a dry etch process as shown in a view 200D of FIG. 2D. An opening 216 is formed by etching the second portion 214 of the exposed portion 208 of the layer 206 to a top surface of the conductive layer 204. The etching process may be any etching process suitable for etching materials of the layer 206. In some embodiments, the etching process may use a predominantly anisotropic etching process. In some embodiments, the etching process may be a plasma-based dry etching process. For example, the layer 206 may be exposed to an etching plasma over the entire substrate surface (blanket etching) or limited to a specific area of the substrate. The etching plasma may be formed from any suitable gases used to etch polymers, such as an oxygen-containing gas, for example oxygen ($O_2$) based gases or carbon tetrafluoride ($CF_4$) based gases. The plasma conditions and etch rate are selected based on the thickness of the layer 206 and the desired etched feature. The etching serves to remove the second portion 214 to expose the conductive layer 204 and to make the sidewalls of the opening 216 vertical (increasing reliability). The plasma dry etch process produces a substantially anisotropic etch that helps to form the vertical sidewalls. A bias power applied to the substrate may also be used and adjusted to enhance the anisotropic nature of the plasma dry etch processing. The gas flow used in the dry etch processing may also be adjusted to be more directional with the etching to facilitate in controlling the vertical sidewall etching aspects for the via. The use of plasma dry etch also increases the critical dimension (CD) control when compared to a lithography process.

The etching may remove a portion of a top surface 218 of the layer 206 as well as the second portion 214 of the exposed portion 208 to form the opening 216. The inventors have found that the etching rate of exposed uncured polymer material is greater than the etching rate of unexposed uncured polymer material. The exposed uncured polymer material etching rate may be approximately 30% or more higher than the unexposed uncured polymer material etching rate. As noted above, the faster etching rate for the exposed uncured polymer material may be attributed to the exposure during the lithography process causing alteration of the properties of the polymer material. The differences in etching rates advantageously allows for a blanket etching process of the substrate where the second portion 214 of the exposed portion 208 is removed much faster than on the top surface 218 of the layer 206.

Figure 2E:
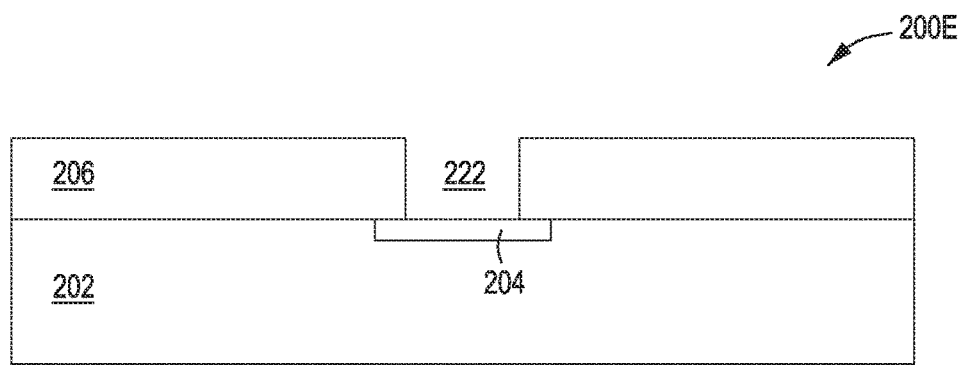

Next at block 110, the layer 206 is cured to form via 222 as depicted in view 200E of FIG. 2E. The layer 206 is cured at temperatures that harden and improve the physical and chemical properties of the layer 206. In some embodiments, the curing temperature of the layer 206 may be significantly higher than the temperatures used in performing other processing steps of the method 100. In some embodiments, for example, where the layer 206 comprises PI or PBO, the layer 206 may be cured at a temperature from approximately 180° C. to approximately 350° C. In some embodiments, the layer 206 is cured using convective heating. In some embodiments, microwave energy, for example, variable frequency microwave (VFM) energy maybe used to cure the layer 206.

The resulting via 222 is formed through the layer 206 and includes one or more sidewalls defined by portions of the layer 206 and a bottom defined by an exposed top portion of the conductive layer 204. Although only one via 222 is shown, the layer 206 may include a plurality of openings corresponding to a plurality of vias to be formed in the layer 206. Each via 222 has dimensions selected to facilitate the creation of a small via (e.g., an opening with a dimension less than approximately or equal to 10 microns, such as a square area having an area of approximately 10×10 microns, or a circular area having a diameter of approximately 10 microns).

Figure 3:
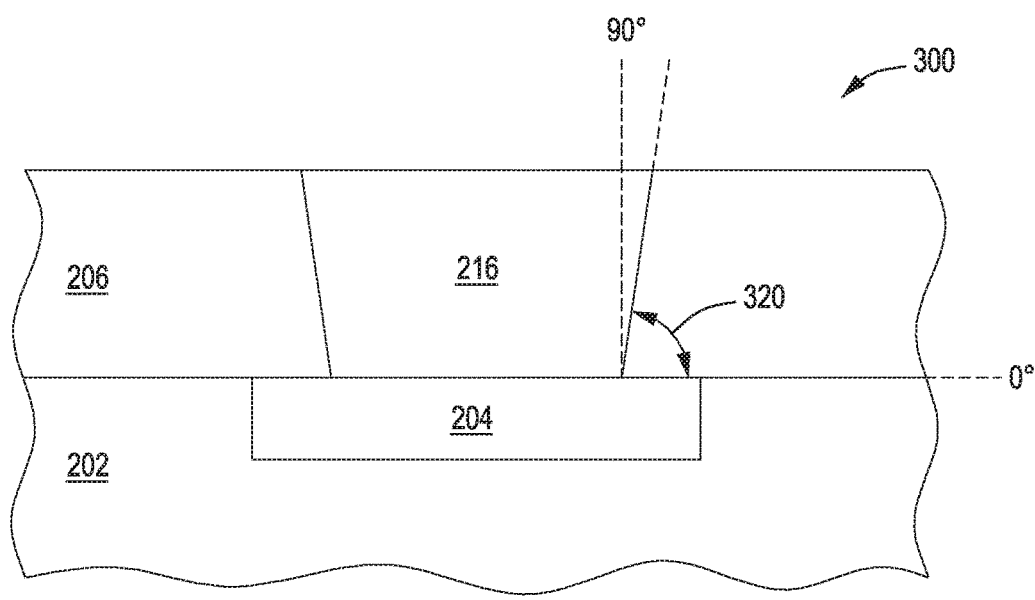
FIG. 3 depicts a side view of a side wall angle in a polymer via formed in accordance with some embodiments of the present principles.

In FIG. 3, a view 300 illustrates a profile of the via 222 formed by methods of the present principles. The sidewalls of the via 222 are vertical or substantially vertical. For example, in some embodiments, the sidewalls of the opening may have a profile with a vertical angle 320 of approximately 80 degrees to approximately 90 degrees, advantageously increasing reliability and density of the vias.

The vias formed using the methods of the present principles can advantageously have a smaller size than typically possible when just photo-patterning the vias directly on a layer of uncured polymer. The opening created in the polymer layer formed by lithography and then a dry plasma etch has better resolution (e.g., 10 μm) with better control of via uniformity and profile angle, as the opening geometry is no longer dependent on uncured polymer material properties. Methods in accordance with the present principles advantageously open up the possibility to use uncured polymer material in the formation of much smaller via sizes. Improved via resolution further provides improved I/O density and also allows for direct via-stacked-on-via designs that further improve the allowable I/O density.

While the foregoing is directed to embodiments of the present principles, other and further embodiments of the principles may be devised without departing from the basic scope thereof.

The invention claimed is:

1. A method for forming a via in a substrate, comprising:
   depositing a layer of uncured polymer material atop a substrate to cover a conductive layer which is exposed on the substrate;
   exposing at least one area of the layer of uncured polymer material using a photolithography process;
   developing the layer of uncured polymer material in the photolithography process to remove a first portion of uncured polymer material from the at least one area;
   etching the layer of uncured polymer material with a dry etch process to remove a second portion of uncured polymer material from the at least one area to expose a top surface of the conductive layer and form a via in the layer of uncured polymer material; and
   curing the layer of uncured polymer material to form a cured polymer material layer.

2. The method of claim 1, further comprising:
   using a plasma based dry etch process to etch the layer of uncured polymer material.

3. The method of claim 2, further comprising:
   etching the layer of uncured polymer material with an oxygen based gas.

4. The method of claim 2, further comprising:
   etching the layer of uncured polymer material with a carbon tetrafluoride based gas.

5. The method of claim 2, further comprising:
   adjusting a bias power to enhance a perpendicular etching aspect of the plasma based dry etch process relative to a top surface of the substrate.

6. The method of claim 2, further comprising:
   adjusting a gas flow to enhance a perpendicular etching aspect of the plasma based dry etch process relative to a top surface of the substrate.

7. The method of claim 2, further comprising:
   blanket etching the substrate with the plasma based dry etching process such that the second portion of uncured polymer material is etched at a higher etch rate than an upper surface of the substrate.

8. The method of claim 1, further comprising:
   forming the via in the layer of uncured polymer material with a size of less than approximately 10 microns.

9. The method of claim 8, further comprising:
   forming the via in the layer of uncured polymer material with a size of less than approximately five microns.

10. The method claim 1, further comprising:
    using an optical mask to expose the at least one area of the layer of uncured polymer material on the substrate in the photolithography process.

11. The method of claim 1, further comprising:
    forming the via with a sidewall profile angle of approximately 80 degrees to approximately 90 degrees.

12. The method of claim 1, wherein the conductive layer is a copper-based material, an aluminum-based material, a gold-based material, a silver-based material.

13. A method for forming a via in a substrate, comprising:
    spin coating a layer of uncured polymer material atop a substrate to cover at least one conductive layer that is exposed on the substrate;
    exposing at least one area of the layer of uncured polymer material above the at least one conductive layer with an ultraviolet light;
    removing a first portion of uncured polymer material from the at least one area exposed by the ultraviolet light with a solvent wash;
    etching the layer of uncured polymer material with an anisotropic dry etch process to remove a second portion of uncured polymer material from the at least one area to expose a top surface of the conductive layer and form a via of less than or equal to approximately 10 microns in the layer of uncured polymer material; and
    curing the layer of uncured polymer material to form a cured polymer material layer.

14. The method of claim 13, further comprising:
    using a plasma based dry etch process to etch the layer of uncured polymer material.

15. The method of claim 14, further comprising:
    etching the layer of uncured polymer material with an oxygen based gas or a carbon tetrafluoride based gas.

16. The method of claim 14, further comprising:
    adjusting a bias power to enhance a perpendicular etching aspect of the plasma based dry etch process relative to a top surface of the substrate.

17. The method of claim 14, further comprising:
    adjusting a gas flow to enhance a perpendicular etching aspect of the plasma based dry etch process relative to a top surface of the substrate.

18. The method of claim 13, further comprising:
    curing the layer of uncured polymer material at a temperature of approximately 180° C. to approximately 350° C. to form the cured polymer material layer.

19. A non-transitory computer readable medium having instructions stored thereon that, when executed, cause a method of operating a wafer level processing system to be performed, the method comprising:
    spin coating a layer of uncured polymer material atop a substrate to cover at least one conductive layer that is exposed on the substrate;
    exposing at least one area of the layer of uncured polymer material above the at least one conductive layer with an ultraviolet light;
    removing a first portion of uncured polymer material from the at least one area exposed by the ultraviolet light with a solvent wash;
    etching the layer of uncured polymer material with an anisotropic dry etch process to remove a second portion of uncured polymer material from the at least one area to expose a top surface of the conductive layer and form a via of less than or equal to approximately 10 microns in the layer of uncured polymer material; and curing the layer of uncured polymer material to form a cured polymer material layer.

20. The non-transitory computer readable medium of claim 19, wherein the via has a width or diameter of less than or equal to approximately five microns.

* * * * *

UNITED STATES PATENT AND TRADEMARK OFFICE
CERTIFICATE OF CORRECTION

PATENT NO. : 10,636,696 B1  
APPLICATION NO. : 16/251355  
DATED : April 28, 2020  
INVENTOR(S) : Yu Gu et al.

Page 1 of 1

It is certified that error appears in the above-identified patent and that said Letters Patent is hereby corrected as shown below:

In the Specification

Column 6, Line 63, delete "approximately 10×10 microns" and replace with "approximately $\leq 10 \times 10$ microns"

Column 6, Line 64, delete "approximately 10 microns" and replace with "approximately $\leq 10$ microns"

Column 7, Line 11, delete "(e.g., 10 μm)" and replace with "(e.g., $\leq 10$ μm)"

Signed and Sealed this  
Fourth Day of August, 2020

Andrei Iancu  
*Director of the United States Patent and Trademark Office*